US008749198B2

(12) United States Patent
Klesyk

(10) Patent No.: US 8,749,198 B2
(45) Date of Patent: Jun. 10, 2014

(54) CONTROL PILOT DETECTION CIRCUIT

(75) Inventor: Krzysztof Klesyk, Novi, MI (US)

(73) Assignee: Lear Corporation, Southfield, MI (US)

(*) Notice: Subject to any disclaimer, the term of this patent is extended or adjusted under 35 U.S.C. 154(b) by 413 days.

(21) Appl. No.: 13/293,345

(22) Filed: Nov. 10, 2011

(65) Prior Publication Data
US 2013/0119931 A1    May 16, 2013

(51) Int. Cl.
*H02J 7/00* (2006.01)
(52) U.S. Cl.
USPC .......................................... 320/109; 320/108
(58) Field of Classification Search
USPC .......................................... 320/109
See application file for complete search history.

(56) References Cited

U.S. PATENT DOCUMENTS

| | | | |
|---|---|---|---|
| 2008/0136371 A1* | 6/2008 | Sutardja | 320/109 |
| 2009/0246596 A1* | 10/2009 | Sridhar et al. | 429/34 |
| 2010/0017249 A1* | 1/2010 | Fincham et al. | 705/8 |
| 2010/0141203 A1* | 6/2010 | Graziano et al. | 320/109 |
| 2010/0225274 A1 | 9/2010 | Fujitake | |
| 2010/0228413 A1 | 9/2010 | Fujitake | |
| 2010/0292890 A1 | 11/2010 | Morris | |
| 2010/0295507 A1 | 11/2010 | Ishii et al. | |
| 2010/0299008 A1 | 11/2010 | Mitsutani | |
| 2011/0166725 A1* | 7/2011 | Booth et al. | 701/22 |
| 2011/0202192 A1* | 8/2011 | Kempton | 700/291 |
| 2011/0210698 A1* | 9/2011 | Sakai | 320/109 |
| 2012/0049796 A1* | 3/2012 | Fukatsu | 320/109 |

* cited by examiner

*Primary Examiner* — Arun Williams
(74) *Attorney, Agent, or Firm* — Brooks Kushman P.C.

(57) ABSTRACT

A control pilot detection circuit operable with a control pilot signal provided from an electric vehicle supply equipment (EVSE) system to facilitate output of a control pilot wake-up signal. The control pilot wake-up signal may be operable with a controller to facilitate controlling operations of a vehicle charging system, such as to facilitate charging a high voltage battery included within a vehicle.

20 Claims, 10 Drawing Sheets

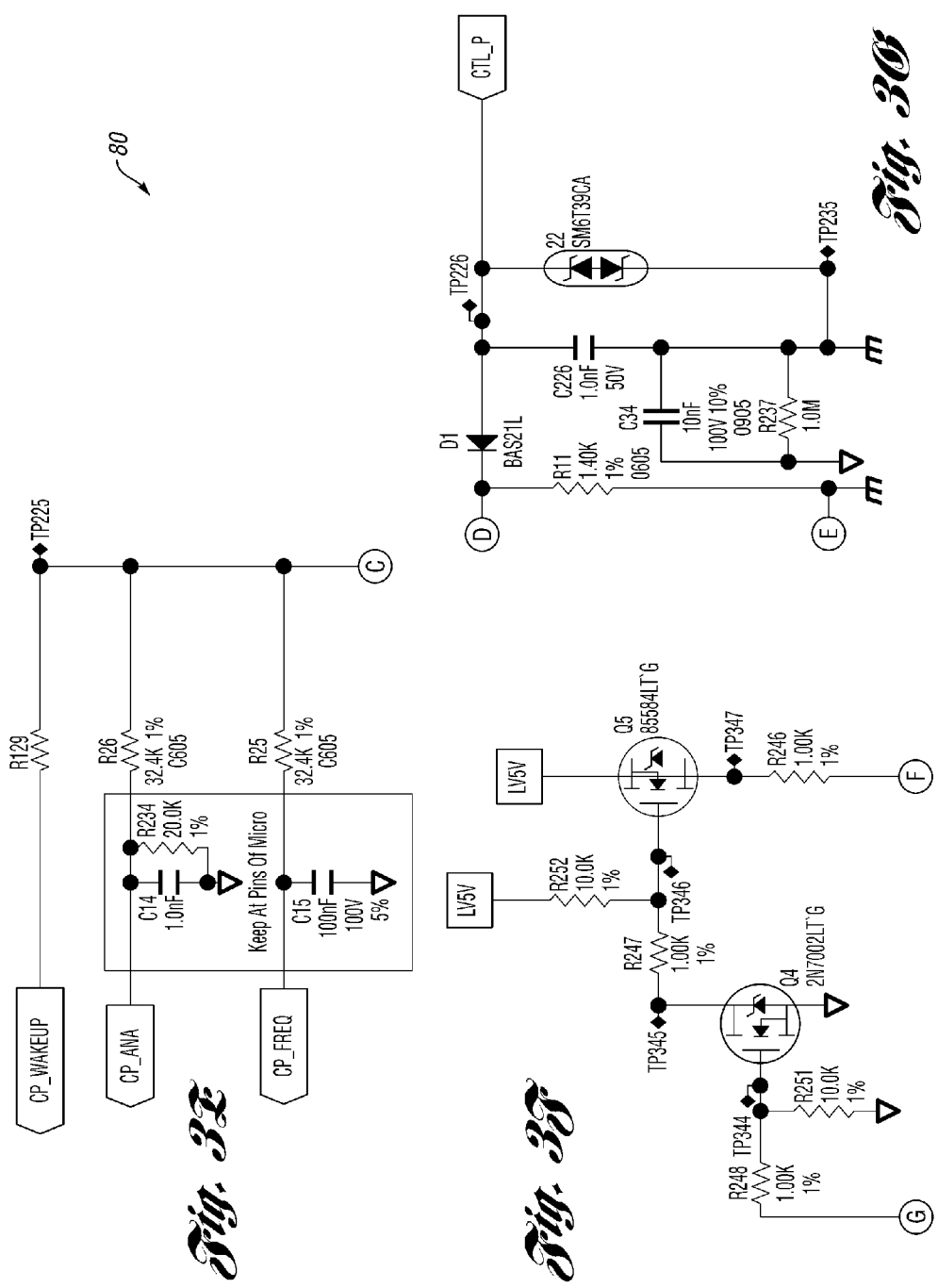

CONTROL PILOT DETECTION CIRCUIT

TECHNICAL FIELD

The present invention relates to control pilot detection circuits, such as but not necessary limited to those included within a vehicle charging system of a vehicle to facilitate output of the control pilot wake-up signal.

BACKGROUND

An on-board vehicle charger may be used to charge a high voltage battery found in a hybrid electric or electric vehicle to provide energy to an electrically powered motor. In some cases, the charging may be facilitated with a cordset or other element having capabilities to facilitate current delivery to the on-board charger, such as from a wall charger or other type of charging station. The cordset may include an adaptor to facilitate attachment to an outlet or other receptacle associated with the on-board charger. The on-board charger may include electronics or other elements to control and manage current flow to the high voltage battery and other related charging operations.

SUMMARY

One non-limiting aspect of the present invention relates to a control pilot detection circuit for use in providing a control pilot wake-up signal to a controller of a vehicle charging system, the controller relying on the control pilot wake-up signal to facilitate charging a high voltage battery of a vehicle, the control pilot detection circuit comprising: a wake-up circuit configured to receive a control pilot signal, the control pilot signal having a frequency for a period of time, the wake-up circuit processing the control pilot signal to output the control pilot wake-up signal to the controller, the control pilot wake-up signal being output as a pulse that begins after a beginning of the period of time and completes prior to an ending of the period of time.

The control pilot detection circuit may be configured such that the wake-up circuit includes a first AC coupled portion and a second AC coupled portion cooperatively configured to define the duration of the pulse.

The control pilot detection circuit may be configured such that the first AC coupled portion sets a start of the pulse and the second AC coupled portion sets a termination of the pulse, the duration of the pulse lasting from the start to the termination.

The control pilot detection circuit may be configured such that the first AC coupled portion mirrors the second AC coupled portion in that each of the first and second AC coupled portions include identical component configurations.

The control pilot detection circuit may be configured such that input of each of the first and second AC coupled portions are commonly connected to a node at which the control pilot signal is received.

The control pilot detection circuit may be configured such that an output of the second AC coupled portion outputs to a switch configured to short an output of the first AC coupled portion configured to output of the control pilot signal.

The control pilot detection circuit may be configured such that a latching circuit is configured to receive the control pilot signal output from the wake-up circuit, the latching circuit elongating the duration of the pulse prior to providing the control pilot signal to the controller.

One non-limiting aspect of the present invention relates to vehicle charging system comprising: an on-board charger operable charging a high voltage battery of a vehicle with AC energy provided through an electric vehicle supply equipment (EVSE) system, a controller of the on-board charger requiring receipt of a control pilot wake-up signal in order to facilitate charging the high-voltage battery; and a wake-up circuit configured to receive a control pilot signal provided through the EVSE system, the wake-up circuit processing the control pilot signal to output the control pilot wake-up signal to the controller, the control pilot wake-up signal being output as a pulse that begins after receipt of the control pilot signal and completes prior to terminating receipt of the control pilot signal.

The vehicle charging system may be configured such that the control pilot signal has a frequency for a period of time and wherein the pulse of the control pilot wake-up signal has a duration defined from a start to an end, wherein the start of the pulse occurs after a beginning of the period of time and the end of the pulse occurs prior to a conclusion of the period of time.

The vehicle charging system may be configured such that the wake-up circuit includes a first capacitive coupled portion and a second capacitive coupled portion cooperatively configured to define the duration of the pulse.

The vehicle charging system may be configured such that the second capacitive coupled portion is delayed relative to the first capacitive coupled portion such that the first capacitive coupled portion sets the start of the pulse and the second capacitive coupled portion sets the end of the pulse.

The vehicle charging system may be configured such that an input of each of the first and second capacitive coupled portions are commonly connected to a node at which the control pilot signal is received.

The vehicle charging system may be configured such that an output of the second capacitive coupled portion outputs to a switch configured to short an output of the first capacitive coupled portion configured to output of the control pilot signal.

The vehicle charging system may further be configured such that a latching circuit configured to receive the control pilot signal output from the wake-up circuit, the latching circuit elongating the duration of the pulse prior to providing the control pilot signal to the controller.

The vehicle charging system may further be configured such that a proximity detection circuit configured to process a proximity signal received through the EVSE system separately from the control pilot signal, the proximity detection circuit processing the proximity signal output to output a proximity wake-up signal to the controller, the controller of the on-board charger requiring receipt of the proximity wake-up signal in order to facilitate charging the high-voltage battery.

One non-limiting aspect of the present invention relates to control pilot detection circuit for use in providing a control pilot wake-up signal to a controller of a vehicle charging system, comprising: a wake-up circuit configured to process a time-varying control pilot signal to output the control pilot wake-up signal, the control pilot wake-up signal being output as a single-pulsed signal characterized by a pulse of a fixed duration, the circuit consuming less than 50 uA while receiving the control pilot signal after output of the pulse.

The control pilot detection circuit may be configured such that the control pilot signal has a frequency over a period of time and wherein the pulse of the control pilot wake-up signal occurs after a beginning of the period of time and before and ending of the period of time.

The control pilot detection circuit may be configured such that the wake-up circuit includes a first capacitive coupled portion and a second capacitive coupled portion cooperatively configured to define the fixed duration of the pulse.

The control pilot detection circuit may be configured such that the second capacitive coupled portion is delayed relative to the first capacitive coupled portion such that the first capacitive coupled portion sets the start of the pulse and the second capacitive coupled portion sets the end of the pulse.

The control pilot detection circuit may be configured such that an input of each of the first and second capacitive coupled portions are commonly connected to a node at which the control pilot signal is received, and wherein an output of the second capacitive coupled portion outputs to a switch configured to short an output of the first capacitive coupled portion configured to output of the control pilot signal.

BRIEF DESCRIPTION OF THE DRAWINGS

FIGS. 3a-3g illustrate a control pilot detection circuit as contemplated by one non-limiting aspect of the present invention.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
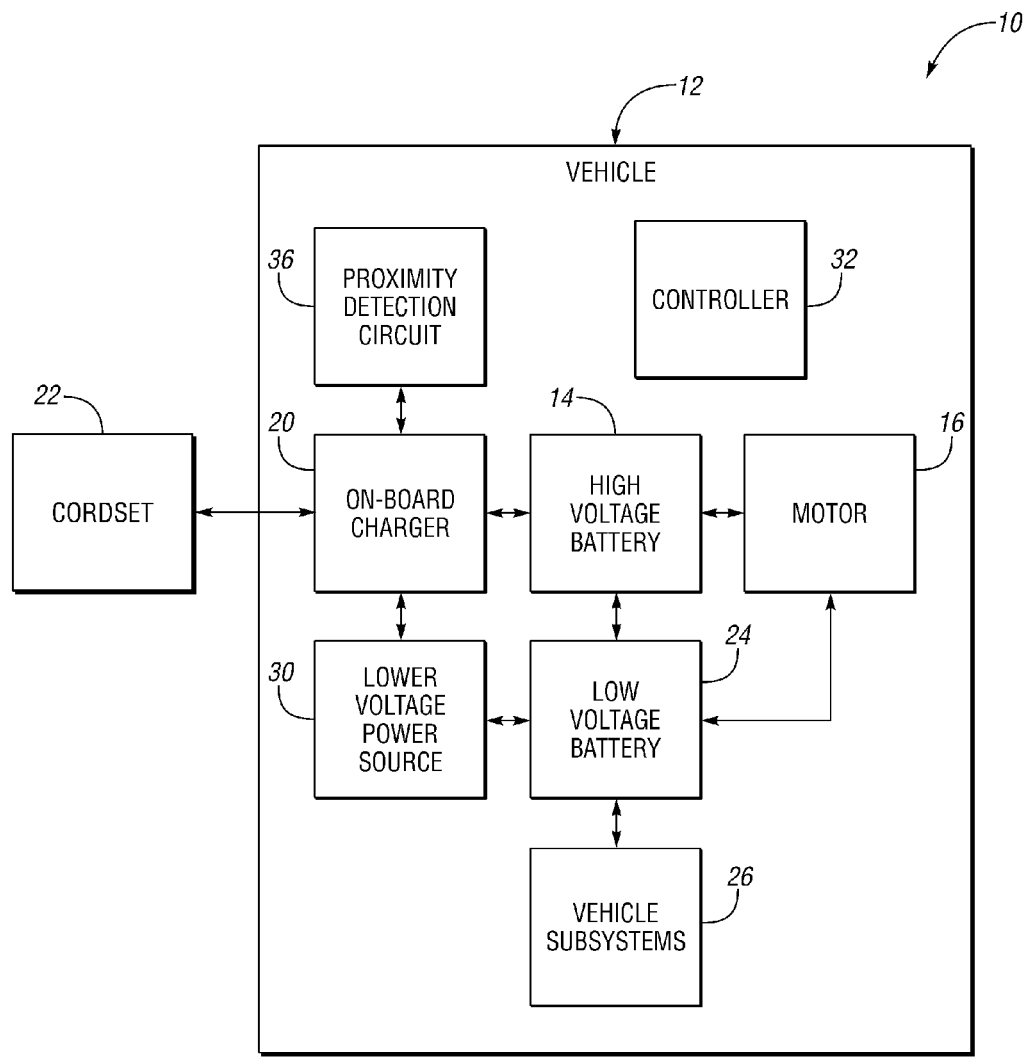
FIG. 1 schematically illustrates logical elements associated with a vehicle power system as contemplated by one non-limiting aspect of the present invention.

FIG. 1 functionally illustrates logical elements associated with a vehicle power system 10 in accordance with one non-limiting aspect of the present invention. The vehicle power system 10 is shown and predominately described for use within an electric vehicle, hybrid electric vehicle, or other vehicle 12 having a high voltage battery 14 or other energy source operable to provide energy sufficient for use by an electric motor 16 to drive the vehicle 12. The vehicle 12 may include an on-board charger 20 to facilitate charging the high voltage battery 14 with current delivered through an electric vehicle supply equipment (EVSE) system 22, which may include a cordset to connect the on-board charger to a wall charger or other charging station (not shown). The EVSE system 22 may be used to deliver current through a cable having a terminal (not shown) at one end adapted for receipt within a receptacle or outlet (not shown) associated with the on-board charger 20. U.S. Pat. No. 7,878,866, entitled Connector Assembly for Vehicle Charging, the disclosure of which is hereby incorporated by reference in its entirety herein, discloses such an arrangement that may be used in accordance with the present invention.

The on-board charger 20 may include electronics or other elements operable to control and manage current flow used to support charging related operations for the high voltage battery 14, and optionally, to support charging or otherwise powering a low voltage battery 24, one or more vehicle subsystem 26, and/or other electronically operable elements included within the vehicle 12. The low voltage battery 24 may be included to support powering vehicle systems 26 that operate at voltages lower than the electric motor 16, such as but not limited to remote keyless entry systems, heating and cooling systems, infotainment systems, braking systems, etc. In addition to being charged with energy provided through the EVSE system 22, one or more of the high and low voltage batteries 14, 24 and vehicle subsystems 26 may be operable to power each other and/or to be powered with energy generated by the electric motor 16.

The low voltage battery 24, for example, may be operable to provide energy sufficient for use by a lower voltage power source 30. The lower voltage power source 30 may be operable to regulate current from the low voltage battery 24 for use with one or more of the vehicle subsystems 26 and/or the on-board charger 20. A controller 32 may be included to facilitate executing logical operations and undertaking other processing requirements associated with controlling the on-board charger and/or controller system within the vehicle 12 (optionally, one or more of the elements may include their own controller or processor). For exemplary purposes, the terms 'lower', 'low', and 'high' are used to differentiate voltage levels respectively coinciding with approximately 5 VDC, 12 VDC, and at least 200 VDC, which are commonly used within vehicles to support the operation associated with each of the corresponding energy sources. This is done without intending to unnecessarily limit the scope and contemplation of the present invention as the present invention fully contemplates the energy sources having the same or different voltage levels and/or current production/generation capabilities.

A proximity detection circuit 36 may be included to facilitate a current conservative configuration operable to facilitate registering connection of the EVSE system 22 to the on-board charger 20 while the controller is in the sleep or inactive state. The proximity detection circuit 36 may be operable to transition the controller 32 from the sleep state to the active state, optionally while consuming less than 50-150 uA, such as with a configuration similar to that described within U.S. patent application Ser. No. 13/091,214, the disclosure which is hereby incorporated by reference in its entirety. The proximity detection circuit may be configured to facilitate allowing the controller 32 to remain in a low energy consumption state (e.g., where the controller 32 may be unable to detect connection of the EVSE system 22 or perform other operations) in order to limit the amount of consumed energy while still allowing the controller 32 to be awoken to perform its prescribed operations once the EVSE system 22 is connected or some other event takes places (the other events may relate to other triggering operations associated with capabilities that are unavailable while the controller 22 is in sleep mode).

A control pilot detection circuit 38 may be included to facilitate a current conservative configuration operable to facilitate output of a control pilot wake-up signal to the controller 32. The control pilot detection circuit 38 may be configured to generate the control pilot wake-up signal by processing a control pilot signal output from the EVSE system 22. The controller 32 may rely on the control pilot wake-up signal to assess whether the EVSE system 22 is capable of providing charge sufficient to facilitate charging the high-voltage battery 14 and/or other parameters associated with such a charging operation. The control pilot wake-up signal may be provided through the cordset or other adapter of the EVSE system 22 used to connect to the on-board charger 20. Optionally, the control pilot wake-up signal may be generated to comply with the requirements of Society of Automotive Engineer (SAE) J1772 and International Electrotechnical Commission (IEC) 51851, the disclosures of which are hereby Incorporated by reference in their entirety.

Figure 2:
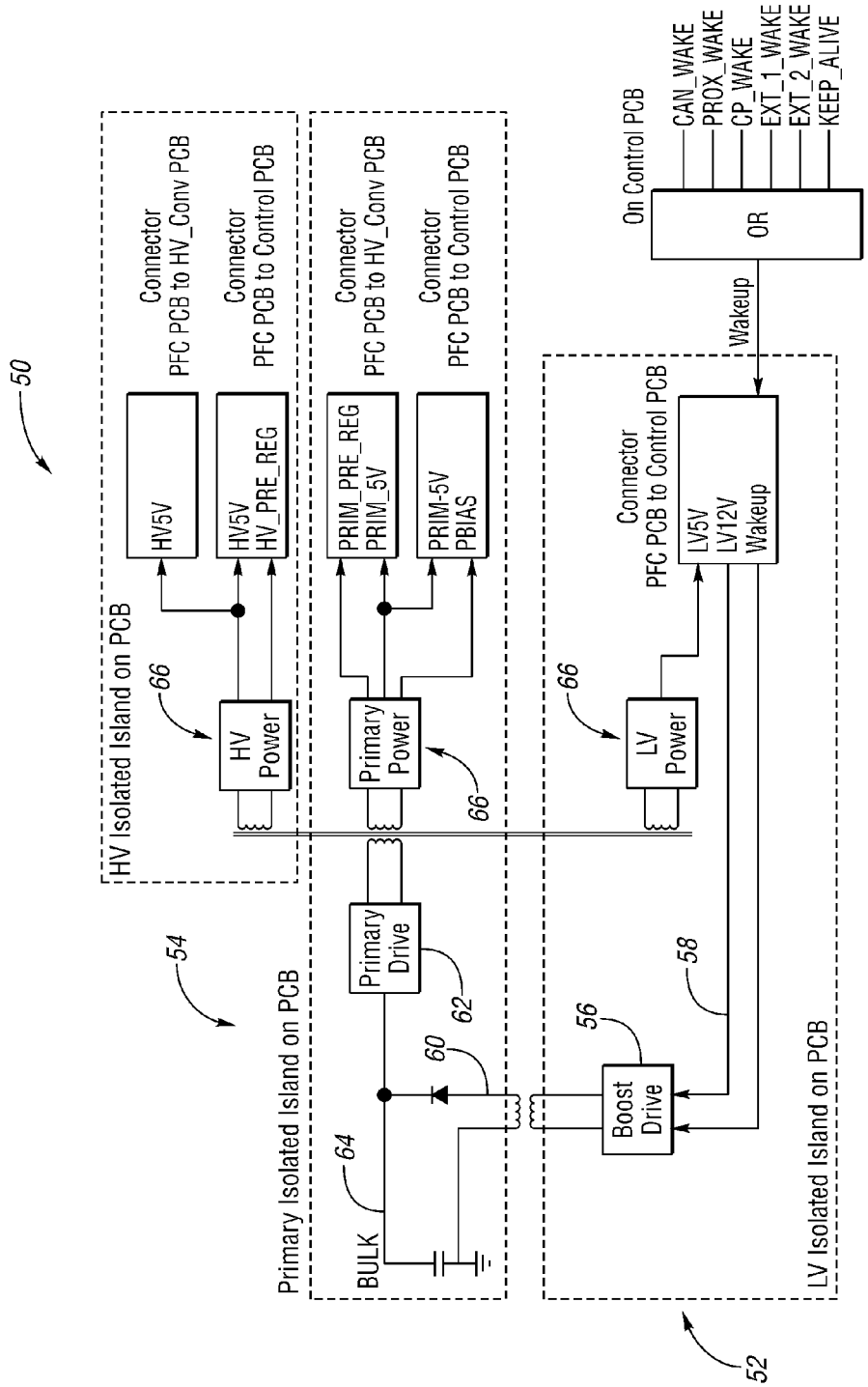
FIG. 2 schematically illustrates a multistage power supply system as contemplated by one non-limiting aspect of the present invention.

FIG. 2 schematically illustrates a multistage power supply system 50 operable with the control pilot wake-up signal in accordance with one non-limiting aspect of the present invention. The multistage power system 50 may correspond with or be included as part of the on-board charger 20 and/or one or more of the other features schematically illustrated in FIG. 1. The multistage power supply system 50 may be of the type described in U.S. patent application Ser. No. 13/192,559, the disclosure which is hereby incorporated by reference in its entirety. The multistage power supply system 50 may rely on the control pilot wake-up signal (CP_WAKE) and/or the proximity detection wake-up signal (PROX_WAKE) to be received by a controller or other associated with the multistage power supply system 50. Of course, the present invention is not necessarily limited to use of the control pilot detection circuit 38 to output the control pilot wake-up signal to the multistage power supply system 50 shown in FIG. 2 and fully contemplates its use and application to other charging systems, and not, necessarily just to exemplarily described vehicle-based charging systems.

The multistage power supply system 50 may comprise a first stage 52 and a second stage 54. The first and second stages 52, 54 of the multistage power supply 50 may be provided in series communication with each other. The first stage 52 of the multistage power supply system 50 comprises a converter 56 for receiving a low voltage input 58 from a vehicle battery (not shown), which may be a 12 volt DC input. The first stage converter 56 is also for converting the vehicle battery low voltage input 58 to a high voltage output 60, which may be a 100 volt DC output. In that regard, the first stage converter 56 may comprise a boost converter for boosting a low voltage 12 volt DC input from the vehicle battery to a high voltage 100 volt DC output. The second stage 54 may comprise a converter 62 for receiving either a rectified AC high voltage input 64 or the high voltage output 60 from the first stage 52. The second stage converter 62, which may be an isolated flyback converter, is also for converting the rectified AC high voltage input 64 or the first stage high voltage output 60 to a low voltage output 66, which may be a 5 volt DC output, for use in powering vehicle control circuitry.

Figure 3A:
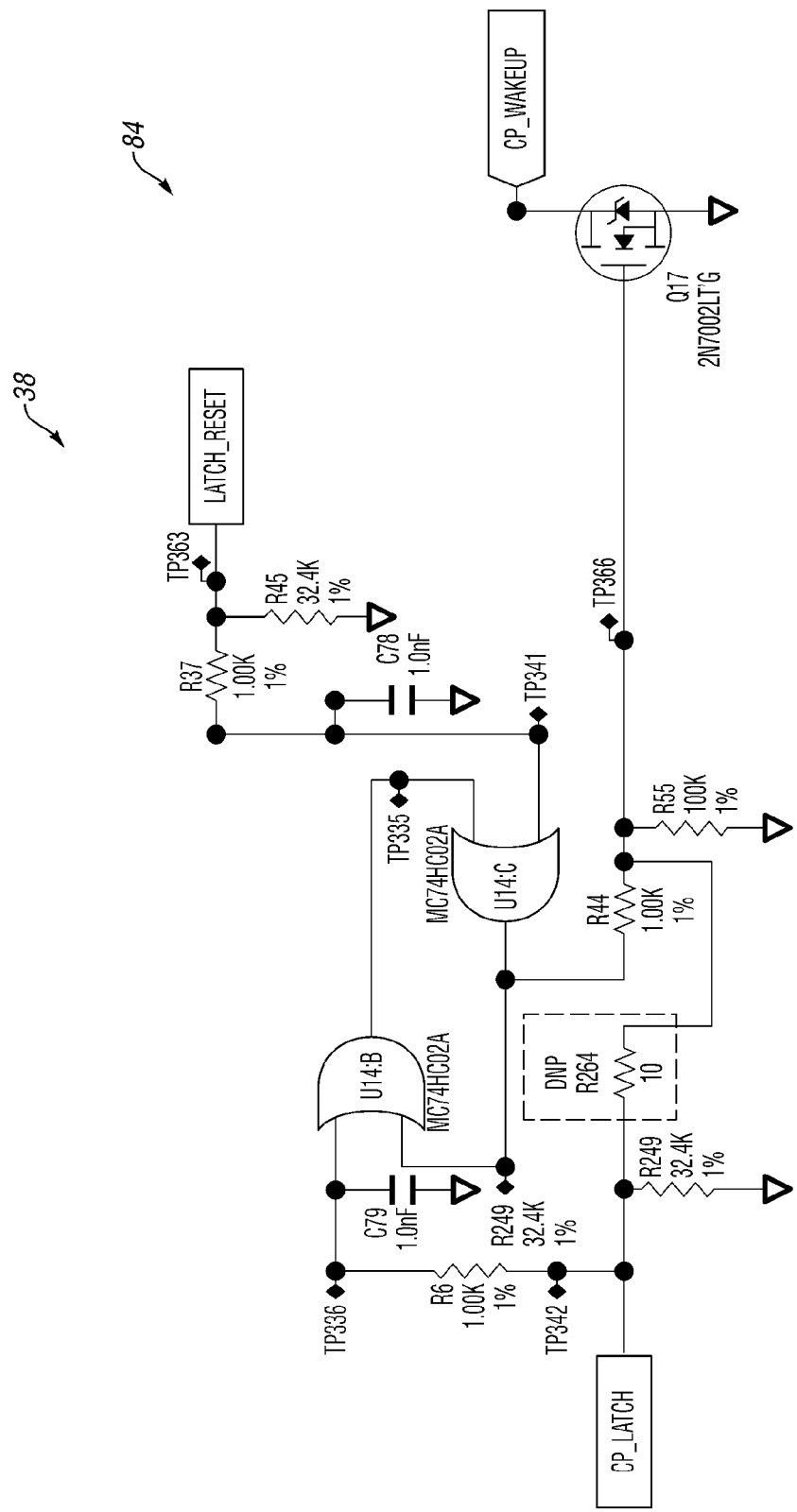
Figure 3B:
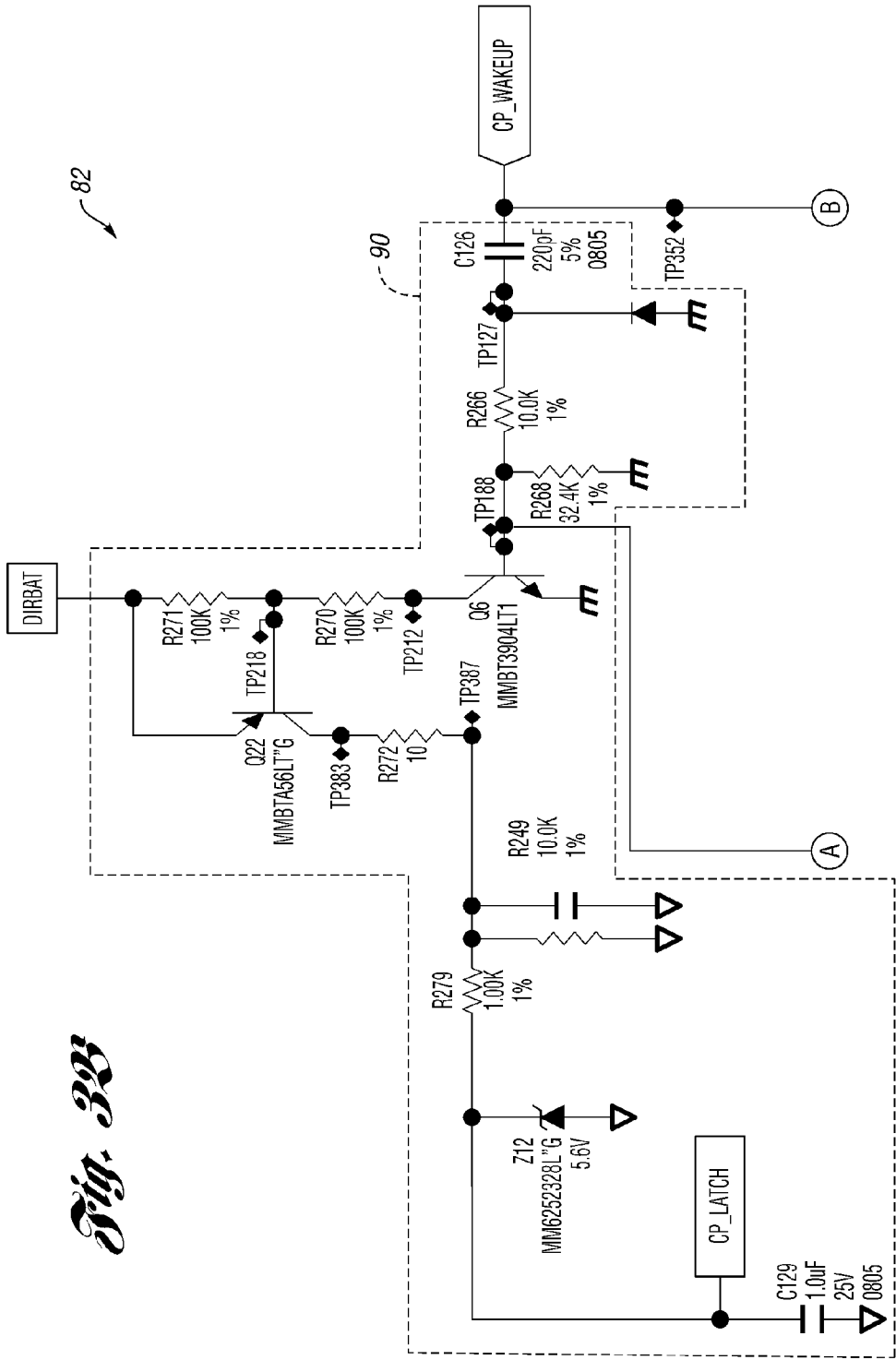
Figure 3C:
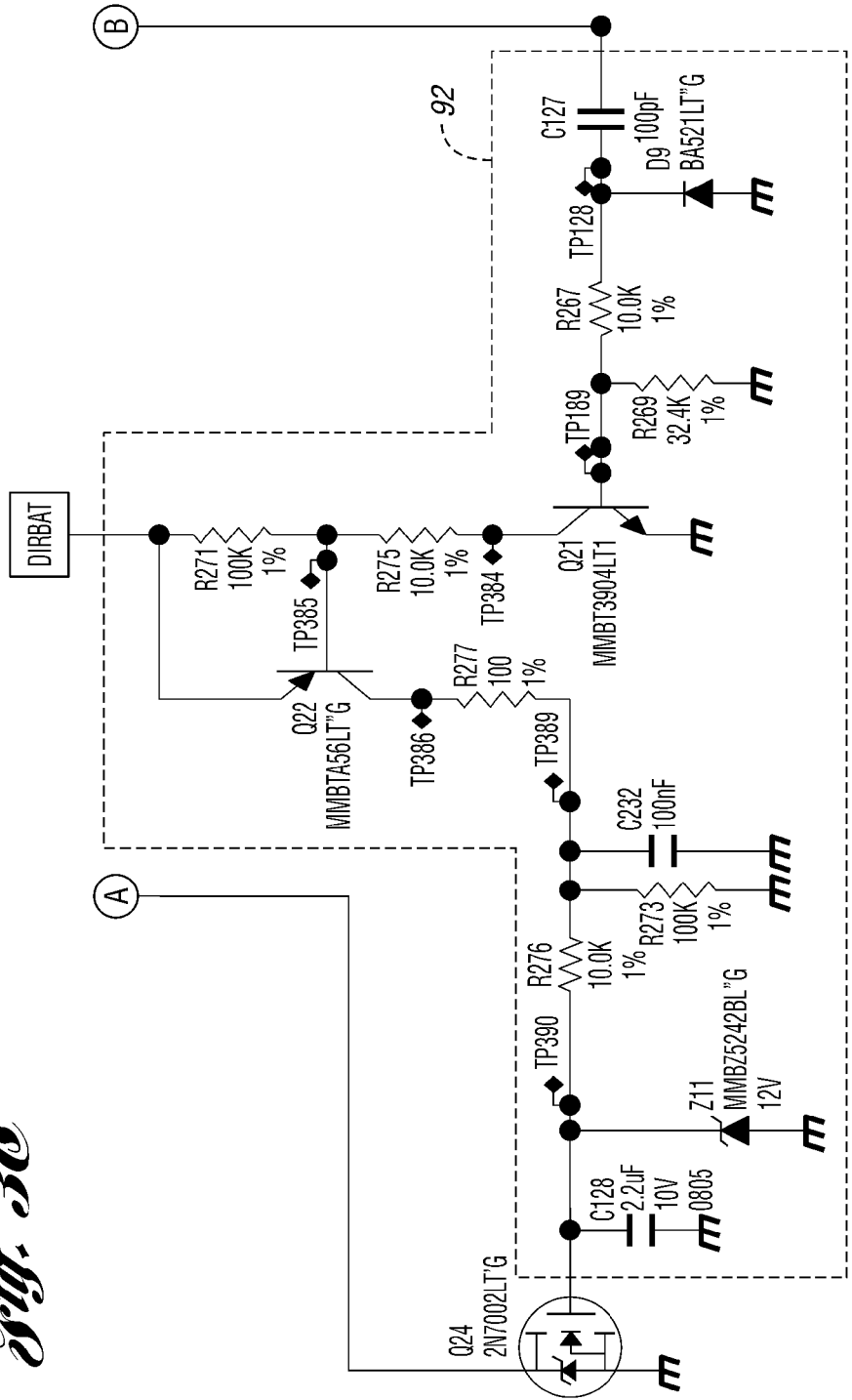
Figure 39:
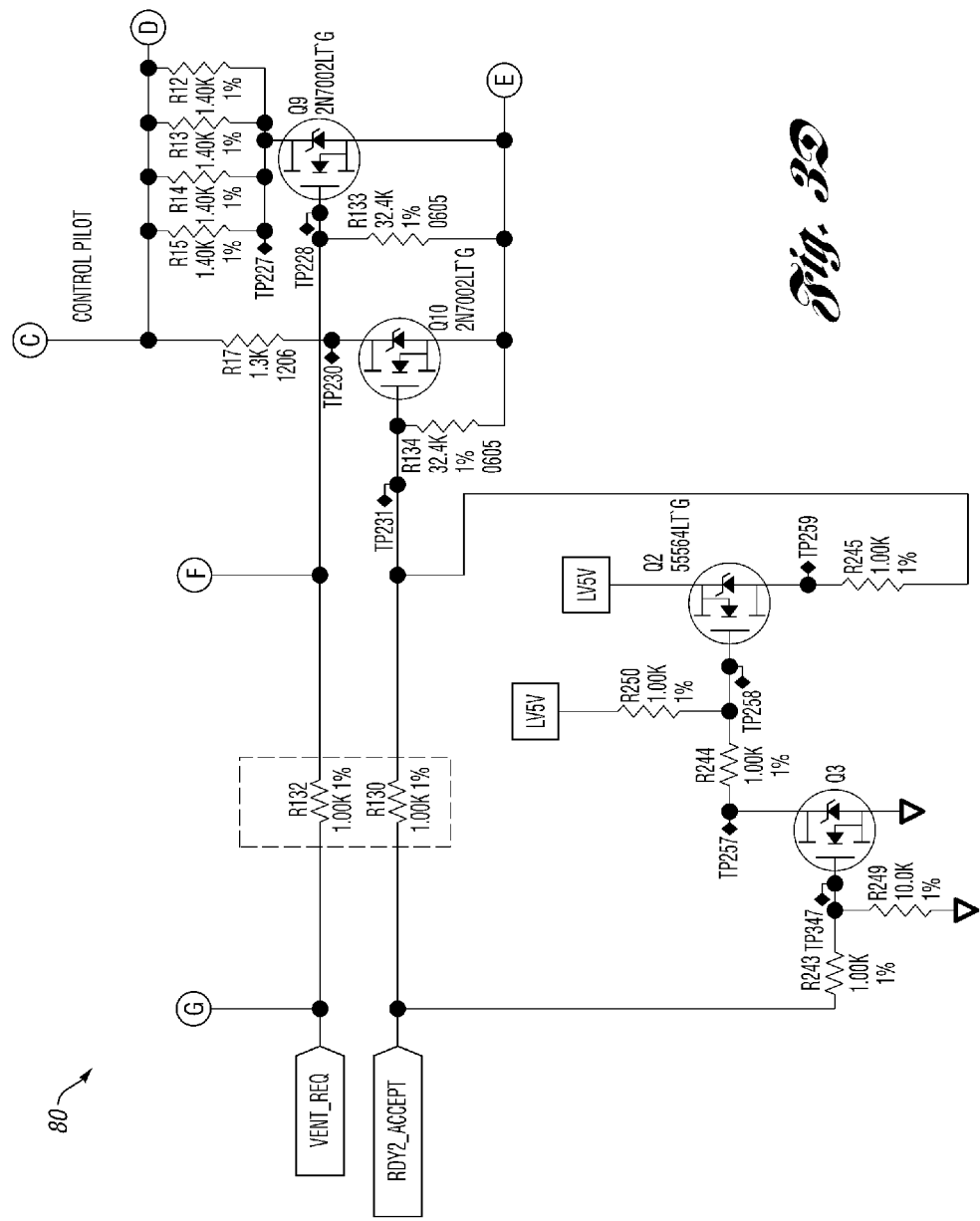

FIG. 3 illustrates the control pilot detection circuit 38 as contemplated by one non-limiting aspect of the present invention. The control pilot detection circuit 38 may include a connection circuit 80, a wake-up circuit 82, and a latch circuit 84. The connection circuit 80 may be configured to receive the control pilot signal CTL_P from the EVSE system 22 and to output the received control signal to the wake-up circuit 82. The wake-up circuit 82 may be configured to output a latching signal CP_LATCH for output to the latching circuit 84 (the control pilot wake-up signal output from the wake-up circuit, as described herein, may be any intermediary signal having a shaped different from that actually output to the controller 32). The latching circuit 84 may be configured to output the control pilot wake-up signal CP_WAKE a pulse sufficient to awaken the controller 32 and other element receiving the control pilot wake-up signal.

The connection circuit 80 may be configured to interact with the EVSE system 22. The connection circuit 80 may include a plurality of outputs and inputs for use with other systems within the vehicle, e.g., a CP_ANA output for detection of the control pilot voltage level; a CP_FREQ output for detection of the control pilot frequency; a VENT_REQ input for selection of the pulldown resistant corresponding to request for vent; and RDY2_ACCEPT input for selection of the pulldown resistance corresponding to request for AC relay closure. The connection circuit 80 may include a CP_WAKEUP output operable to communicate the control pilot input signal (CTL_P) to a CP_WAKEUP input node of the wake-up circuit.

The wake-up circuit 82 may include a first (top) portion 90 and a second (bottom) portion 92 commonly connecting to the CP_WAKEUP input node. As described in more detail below, the first portion 90 may be configured to define a beginning of the pulse output to the latching circuit 84 and the second portion 92 may be configured to define an ending of the pulse. The first portion 90 and the second portion 92 may be capacitive (AC) coupled by way of corresponding capacitors (C126, C127) to the control pilot signal as output from the connection circuit 80 as CP_WAKEUP. The capacitive coupling requires the control pilot signal to be time varying in order for current to be delivered through the first and second portions 90, 92. The first and second portions 90, 92 may be mirror images of each other at least in that each includes the same component configurations (some of the components of the first portion may be connected to a component/PCB ground as opposed to the components of the second portion being connected to an chassis/vehicle ground).

Figure 4:
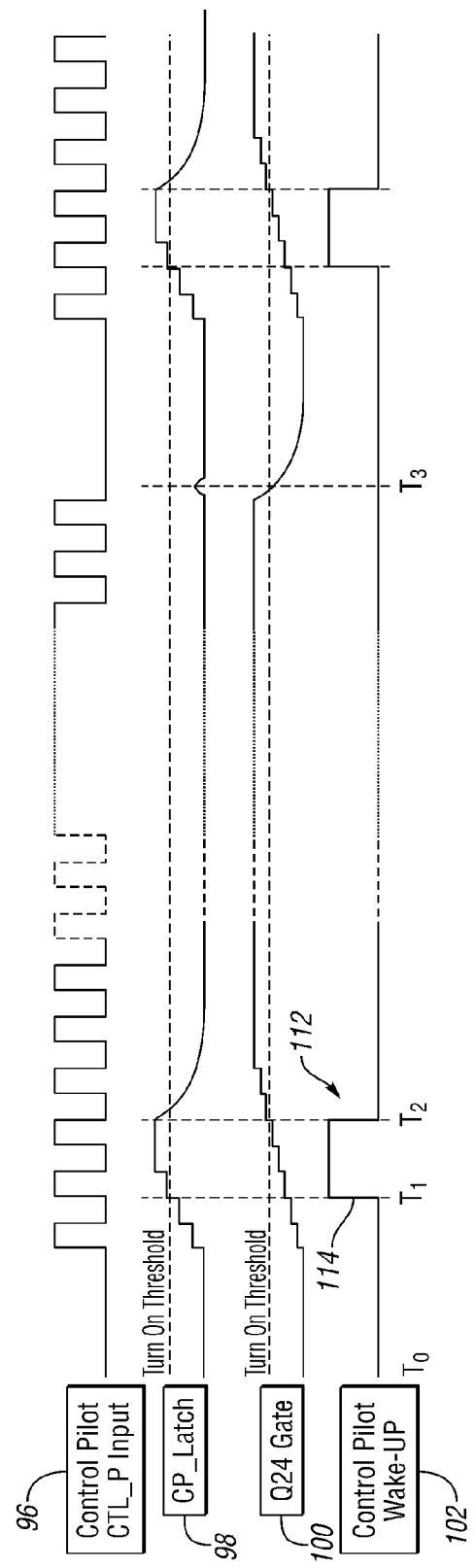
FIG. 4 illustrates signaling diagrams as contemplated by one non-limiting aspect of the present invention.

The first and second portions 90, 92 may be respectively connected to a drain and a gate of a MOSFET (Q24). The MOSFET (Q24) may cooperate with the capacitive differences of the first and second portions 90, 92 to facilitate defining the pulse of the control pilot wake-up signal output from a CP_LATCH to the latching circuit 84. FIG. 4 illustrates signaling diagrams for the signaling associated with the control pilot detection circuit 38 as contemplated by one non-limiting aspect of the present invention. The diagrams illustrate a graph 96 of the control pilot signal CP_WAKEUP, a graph 98 of the CP_LATCH signal output to the latching circuit 84, a graph 100 of a voltage at the gate of the MOSFET (Q24), and a graph 102 of the control pilot wake-up signal CP_WAKE. As shown at a time $T_0$ when the control pilot signal (CP_WAKEUP) is in a steady, non-time varying state, each of the other signals are low. Once the control pilot signal begins to alternate between a high and low state at a frequency then at a time $T_1$, current is passed to the first and second portions 90, 92 of the wake-up circuit.

Figure 5:
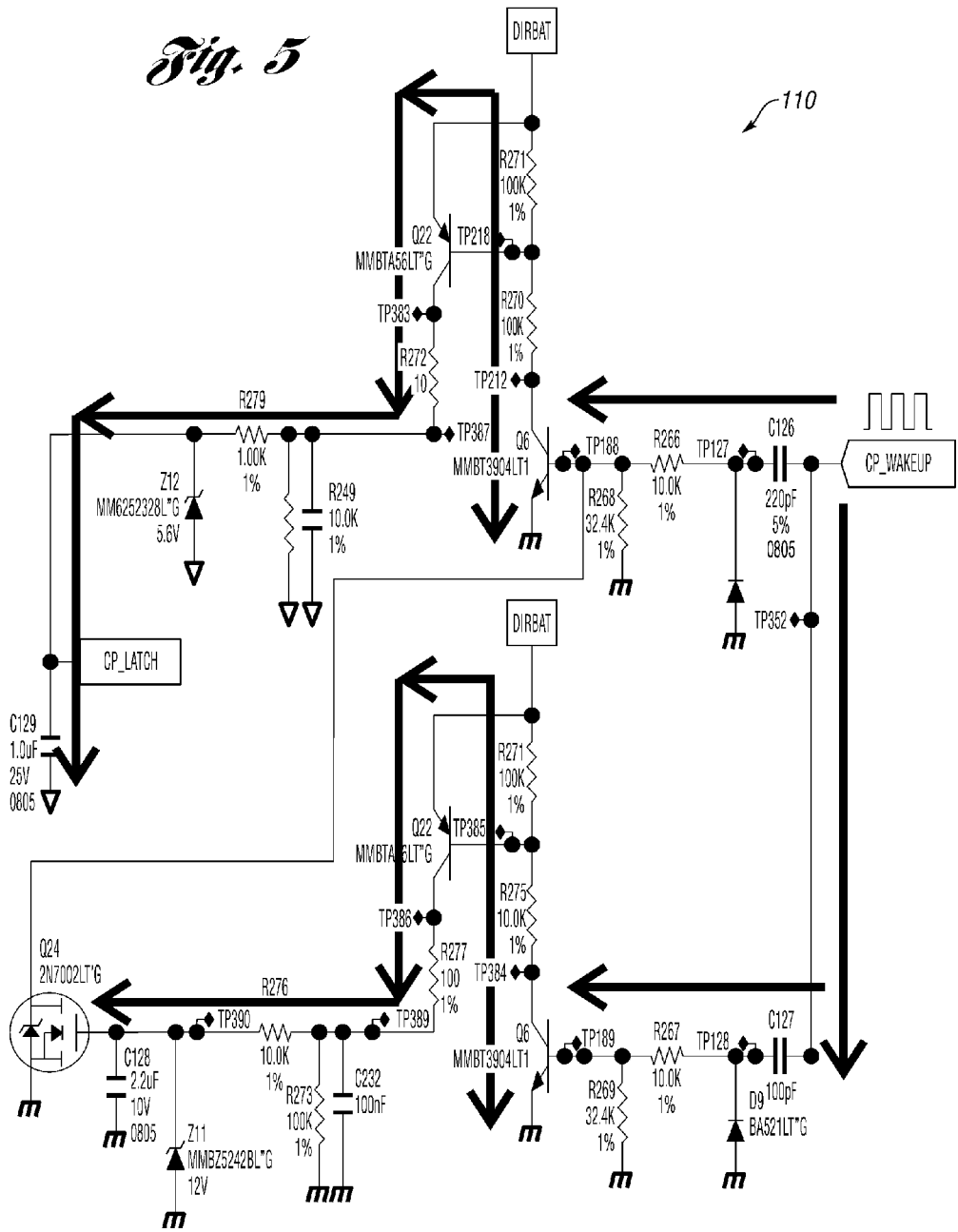
FIGS. 5-6 illustrate current path diagrams through a wake-up circuit as contemplated by one non-limiting aspect of the present invention.
Figure 6:
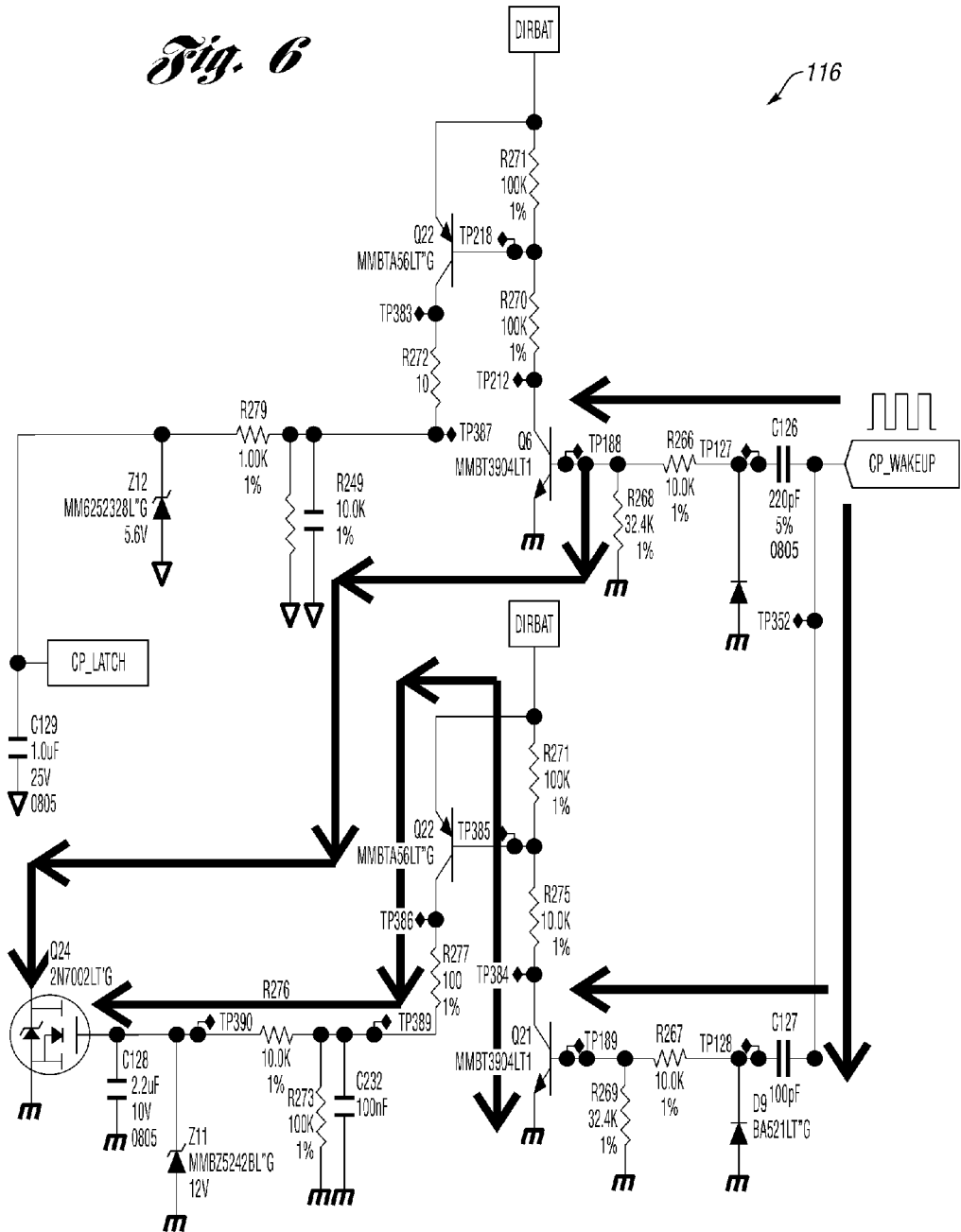

FIG. 5 illustrates a current path diagram 110 of current through the wake-up circuit 82 at the time $T_1$. Due to capacitive differences between the first portion 90 and the second portion 92, the voltage at the CP_LATCH builds more quickly than the voltage at the gate of the MOSFET (Q24). Once the voltage at the CP_LATCH reaches a level sufficient to surpass a turn on voltage of the latching circuit 84, the latching circuit 84 begins generating a pulse 112 of the control pilot signal CP_WAKE, as marked by a beginning portion 114. Thereafter, as the control pilot signal continues in the illustrated time-varying state, the second portion 92 of the wake-up circuit 82 begins to increase in voltage until reading a level sufficient to surpass a turn on voltage of the MOSFET (Q24), which then causes the MOSFET to short a portion the first portion 90 of the wake-up circuit 82. FIG. 6 illustrates a current path diagram 116 of current through the wake-up circuit 82 at the time $T_2$ when the MOSFET (Q24) turns on to short the portion of the first portion 90 of the wake-up circuit 82, i.e., to draw current away from the first portion 90 of the used to deliver current to the CP_LATCH.

From time $T_2$, as long as the control pilot signal continues to exhibit the time-varying condition, the gate of the MOS- FET (Q24) remains above its turn on threshold such that current continues to be diverted from the portion of the first portion 90 of the circuit used to power the CP_LATCH, causing the CP_LATCH voltage to eventually drop to 0 V. At this point, current consumption of the wake-up circuit 82 may be reduced below 100 uA, and preferably to no more than 40 uA. Once the time varying nature of the control pilot signal ceases, such as when the EVSE system 22 is disconnected from the vehicle or otherwise interrupted, the voltage at the gate of the MOSFET (Q24) may begin to drop until into drops below its turn on threshold to 0 V. At this point, current consumption of the wake-up circuit 82 may be really reduced below 5 uA, and preferably to no more than 1 uA. The wake-up circuit, thereafter, may reinitialize upon subsequent receipt of the control pilot signal to allow the wake-up circuit to provide another pulse as the control pilot wake-up signal in order to the controller 32 again.

The capacitive coupling of the first portion 90 and the second portion 92 of the wake-up circuit cooperate to define the noted pulse of the control pilot wake-up signal CP_WAKE. This capacitive coupling can potentially result in a time varying signal masking an actual control pilot signal being communicated to the wake-up circuit 82. In particular, some testing requirements may induce certain ground shift conditions which could mask receipt of the control pilot signal (CP_WAKEUP) and result in an improper determination of the wake-up circuit of the control pilot signal, e.g., conditions under which a 5 V supply (LV5V) from the low-voltage power source 30 floats relative to a chassis/vehicle ground. To prevent such conditions from biasing the MOSFETS Q9, Q10, i.e., unintentionally turning on/off to Q9, Q10, the connection circuit may be configured to with a biasing portion characterized by MOSFETs Q4, Q5 being configured to insure the gates of MOSFETS Q9, Q10 will remain at zero while the crown floats.

Returning to FIG. 2, the various circuits of the control pilot detection circuit 38, i.e., the connection circuit 80, the wake-up circuit 82, and the latching circuit 84, are shown to include a plurality of electrical components. As noted above, the components of the first portion 90 and second portion 92 of the wake-up circuit 82 may mirror each other in that they include the same component configurations (except for some of components having different characteristics values and/or groundings) which may be helpful in ameliorating manufacturing cost by simplifying circuit construction. One or more of these components, as well as other components comprising the control pilot detection circuit 38, may be may be eliminated in or combined with other ones of the components. In addition, the illustrated values of the components may be varied in some of petitions. The wake-up circuit 82 is shown to include a power source DIRBAT separate from the LV5V power source to facilitate a separate supply to the wake-up circuit, however, the preservation fully contemplates using the same power source for both circuits. Optionally, the latching circuit 84 may be eliminated and/or configured to output a shape other than the illustrated signal square-shaped pulse. Likewise, rather than emitting a single pulse per initialization of a fixed duration (as measured from pulse start to termination), the direction and/or frequency of the CP_WAKE signal may be adjusted.

As supported above, the control pilot circuit may be configured to support any number of applications and its use within any number of environments. The present invention contemplates the control pilot circuit including a plurality of optional configurations and settings, including settings and configurations which result in: the wake up circuit being implemented using AC coupling capacitors where a top part of this circuit is responsible for generation of a pulse once the control pilot signal is received; a bottom part of this circuit may be responsible for keeping wake up disabled for as long as there is a continuous frequency on control pilot signal is received; dual non-inverting buffers (Q22, Q6 and Q23,Q21) are utilized to lower quiescent current draw; a top buffer is disabled once frequency is present for a minimum time; during control pilot drop out or re-initialization, the bottom part of this circuit will drop out to allow a new wake-up pulse to be generated; a wake-up latch to provide sufficient start up time for the system; a quiescent current draw of 1 uA nominal when not connected to control pilot input and 40 uA nominal when active control pilot is connected; gate drive buffers to prevent Q10 and Q9 mosfets from sticking on during ground shift conditions; a configuration capable of entering sleep mode when the control signal is being received at 1 Khz at a cycle of 2% to 98%; re-waking (e.g. generation of a new pulse) if the control pilot drops out for any reason and is then reinitialized; provide sufficient wake up pulse to keep system alive until microcontroller comes up and drives Keep_Alive pin; providing the control pilot wake-up signal independent of any other wake-up input (e.g., proximity detection); input capacitance should be less than 2.2 nF; and/or ground shift protection between microcontroller ground and chassis ground can be up to +/−1V While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A control pilot detection circuit for use in providing a control pilot wake-up signal to a controller of a vehicle charging system, the controller relying on the control pilot wake-up signal to facilitate charging a high voltage battery of a vehicle, the control pilot detection circuit comprising:
   a wake-up circuit configured to receive a control pilot signal, the control pilot signal having a frequency for a period of time, the wake-up circuit processing the control pilot signal to output the control pilot wake-up signal to the controller, the control pilot wake-up signal being output as a pulse that begins after a beginning of the period of time and completes prior to an ending of the period of time.

2. The control pilot detection circuit of claim 1 wherein the wake-up circuit includes a first AC coupled portion and a second AC coupled portion cooperatively configured to define the duration of the pulse.

3. The control pilot detection circuit of claim 2 wherein the first AC coupled portion sets a start of the pulse and the second AC coupled portion sets a termination of the pulse, the duration of the pulse lasting from the start to the termination.

4. The control pilot detection circuit of claim 2 wherein the first AC coupled portion mirrors the second AC coupled portion in that each of the first and second AC coupled portions include identical component configurations.

5. The control pilot detection circuit of claim 2 wherein input of each of the first and second AC coupled portions are commonly connected to a node at which the control pilot signal is received.

6. The control pilot detection circuit of claim 5 wherein an output of the second AC coupled portion outputs to a switch configured to short an output of the first AC coupled portion configured to output of the control pilot signal.

7. The control pilot detection circuit of claim 1 further comprising a latching circuit configured to receive the control pilot signal output from the wake-up circuit, the latching circuit elongating the duration of the pulse prior to providing the control pilot signal to the controller.

8. A vehicle charging system comprising:
an on-board charger operable charging a high voltage battery of a vehicle with AC energy provided through an electric vehicle supply equipment (EVSE) system, a controller of the on-board charger requiring receipt of a control pilot wake-up signal in order to facilitate charging the high-voltage battery; and
a wake-up circuit configured to receive a control pilot signal provided through the EVSE system, the wake-up circuit processing the control pilot signal to output the control pilot wake-up signal to the controller, the control pilot wake-up signal being output as a pulse that begins after receipt of the control pilot signal and completes prior to terminating receipt of the control pilot signal.

9. The vehicle charging system of claim 8 wherein the control pilot signal has a frequency for a period of time and wherein the pulse of the control pilot wake-up signal has a duration defined from a start to an end, wherein the start of the pulse occurs after a beginning of the period of time and the end of the pulse occurs prior to a conclusion of the period of time.

10. The vehicle charging system of claim 9 wherein the wake-up circuit includes a first capacitive coupled portion and a second capacitive coupled portion cooperatively configured to define the duration of the pulse.

11. The vehicle charging system of claim 10 wherein the second capacitive coupled portion is delayed relative to the first capacitive coupled portion such that the first capacitive coupled portion sets the start of the pulse and the second capacitive coupled portion sets the end of the pulse.

12. The vehicle charging system of claim 11 wherein an input of each of the first and second capacitive coupled portions are commonly connected to a node at which the control pilot signal is received.

13. The vehicle charging system of claim 12 wherein an output of the second capacitive coupled portion outputs to a switch configured to short an output of the first capacitive coupled portion configured to output of the control pilot signal.

14. The vehicle charging system of claim 8 further comprising a latching circuit configured to receive the control pilot signal output from the wake-up circuit, the latching circuit elongating the duration of the pulse prior to providing the control pilot signal to the controller.

15. The vehicle charging system of claim 14 further comprising a proximity detection circuit configured to process a proximity signal received through the EVSE system separately from the control pilot signal, the proximity detection circuit processing the proximity signal output to output a proximity wake-up signal to the controller, the controller of the on-board charger requiring receipt of the proximity wake-up signal in order to facilitate charging the high-voltage battery.

16. A control pilot detection circuit for use in providing a control pilot wake-up signal to a controller of a vehicle charging system, comprising:
a wake-up circuit configured to output the control pilot wake-up signal based on a time-varying control pilot signal, the control pilot wake-up signal being output as a single-pulsed signal characterized by a pulse of a fixed duration, the wake-up circuit consuming less than 50 uA while receiving the control pilot signal after output of the pulse.

17. The control pilot detection circuit of claim 16 wherein the control pilot signal has a frequency over a period of time and wherein the pulse of the control pilot wake-up signal occurs after a beginning of the period of time and before and an ending of the period of time.

18. The control pilot detection circuit of claim 16 wherein the wake-up circuit includes a first capacitive coupled portion and a second capacitive coupled portion cooperatively configured to define the fixed duration of the pulse.

19. The control pilot detection circuit of claim 18 wherein the second capacitive coupled portion is delayed relative to the first capacitive coupled portion such that the first capacitive coupled portion sets the start of the pulse and the second capacitive coupled portion sets the end of the pulse.

20. The control pilot detection circuit of claim 19 wherein an input of each of the first and second capacitive coupled portions are commonly connected to a node at which the control pilot signal is received, and wherein an output of the second capacitive coupled portion outputs to a switch configured to short an output of the first capacitive coupled portion configured to output of the control pilot signal.

* * * * *

UNITED STATES PATENT AND TRADEMARK OFFICE
CERTIFICATE OF CORRECTION

PATENT NO.          : 8,749,198 B2  
APPLICATION NO.     : 13/293345  
DATED               : June 10, 2014  
INVENTOR(S)         : Krzysztof Klesyk et al.

Page 1 of 1

It is certified that error appears in the above-identified patent and that said Letters Patent is hereby corrected as shown below:

In the Claims

Column 10, Line 27, Claim 17:

After "the period of time and before"
Delete "and".

Signed and Sealed this
Twenty-third Day of September, 2014

Michelle K. Lee
*Deputy Director of the United States Patent and Trademark Office*